United States Patent [19]

Takahashi

[11] Patent Number: 5,768,189
[45] Date of Patent: Jun. 16, 1998

[54] CIRCUITRY AND METHOD FOR STABILIZING OPERATING CHARACTERISTICS OF MEMORY AGAINST TEMPERATURE VARIATIONS

[75] Inventor: Mariko Takahashi, Tokyo, Japan

[73] Assignee: NEC Corporation, Tokyo, Japan

[21] Appl. No.: 826,047

[22] Filed: Mar. 28, 1997

[51] Int. Cl.[6] ....................................... G11C 7/00
[52] U.S. Cl. ........................... 365/185.18; 365/185.14; 365/185.16; 365/185.29; 365/189.09; 365/212; 365/218
[58] Field of Search ................. 365/185.18, 185.29, 365/185.14, 185.16, 218, 189.09, 230.06, 148, 212

[56] References Cited

U.S. PATENT DOCUMENTS

| | | | |
|---|---|---|---|
| 5,384,142 | 1/1995 | Miyakawa et al. | 365/185.18 X |
| 5,388,069 | 2/1995 | Kokubo | 365/185.18 X |
| 5,428,568 | 6/1995 | Kobayashi et al. | 365/185.18 X |
| 5,432,738 | 7/1995 | Watsuji et al. | 365/185.18 X |

*Primary Examiner*—Do Hyun Yoo
*Attorney, Agent, or Firm*—Foley & Lardner

[57] ABSTRACT

In a matrix array of memory cells, each memory cell includes a control gate, and first and second terminals for defining a channel therebetween, with the second terminals of the memory cells being connected to a common circuit node. During a write modes a row of memory cells and a column of memory cells are selected, and a first voltage is supplied to the control gates of the memory cells of the selected row and a second voltage which varies positively as a function of temperature is supplied to the first terminals of the memory cells of the selected column for trapping electrons in at least one of the memory cells. During an erase mode, ground potential is supplied to the control gates of all memory cells and a third voltage which varies negatively as a function of temperature is supplied to the common circuit node to remove the trapped electrons from the memory cells.

13 Claims, 3 Drawing Sheets

1

CIRCUITRY AND METHOD FOR STABILIZING OPERATING CHARACTERISTICS OF MEMORY AGAINST TEMPERATURE VARIATIONS

BACKGROUND OF THE INVENTION

1. Field of the Invention

The present invention relates generally to memories, and more specifically to a memory (particularly, a nonvolatile memory) having temperature-dependent operating characteristics.

2. Description of the Related Art

A typical prior art nonvolatile memory is shown in FIG. 1. The memory includes a matrix array of memory cells, or field effect transistors $M_{11}$ to $M_{mn}$ each having a floating gate embedded in a silicon-dioxide layer below the control gate, the control gates of those transistors arranged in each row of the array being connected to the respective word line WL and the drain terminals of those transistors in each column being connected to the respective digit line DL. The word lines are selected by a row address decoder 2 in response to row address data $AD_r$ when it is enabled by a write enable pulse WE. Transistors $4_1$ to $4_n$ of a column selector 4 are connected respectively to the digit lines $DL_1$ to $DL_n$. The memory cells of a digit line are selected by a column decoder 3 in response to column address data $AD_c$ by selectively turning transistors $4_1$ to $4_n$ on. A plurality of such circuits are provided in blocks #1 to #k and one of the blocks is selected when one of transistors $6_1$ to $6_k$ of a block selector 6 is turned on by a block address decoder 5 in response to block address data $AD_b$. All source terminals of the memory cells are connected to a common circuit node 10.

When a memory cell $M_{ij}$ is selected, its drain-source path is connected in series with transistors $4_j$ and $6_j$, and a write-in voltage is supplied from a write circuit 8. In this write circuit, a write data signal WDS is supplied via an N-channel depletion-mode transistor 85 to the gates of N-channel transistor 81 and P-channel transistor 82 which are connected in series to receive a fixed DC voltage. P-channel transistor 83 has its gate connected to the junction between transistors 81 and 82 and its drain-source path connected between the gate of transistor 84 and the drain or transistor 82.

During a write mode, the row address decoder 2 supplies a write-in pulse, typically 12 volts, to the selected word line and the transistors 81, 83 and 84 of the write circuit are turned on in response to the write data signal to supply a voltage Vpp of typically 6 volts through transistors 84, $6_j$, $4_j$ to the memory cell $M_{ij}$ while the erase circuit 7 holds the common circuit node 10 to ground. The memory cell $M_{ij}$ is activated and hot electrons are trapped in its floating gate and its threshold voltage changes from the initial or erase level to the write level. The period taken to complete this change is defined as the write time. However, the conductances of transistors 84, $6_j$ and $4_j$ tend to decrease with temperature, and therefore, the write time increase with temperature. Experiments show that with the prior art device the write time at 100° C. is 3.5 times longer than the write time at 0 C. as illustrated in FIG. 2. This results in memory instability and represents an obstacle to the high speed operation of the nonvolatile memory.

During an erase mode of block #1, the row address decoder 2 is supplied with an erase pulse ER for grounding the control gates of all memory cells, while the erase circuit 7 is supplied with an erase pulse $ER_a$ and a block select signal $BS_1$ to apply an erase voltage to the common circuit node 10. At the same time, the gates of all transistors $4_1$ to $4_n$ are open-circuited. As a result, a high potential is applied across the gate and source terminals of all memory cells and the trapped electrons are purged through their source terminals. The phenomenon of this electron discharge is known as the "Fowler-Nordheim tunneling". When an erasure is completed, the threshold voltage of the memory cells reduces to a level typically at 3 volts. The period taken for each memory cell to change its threshold voltage from the write level to the erase level is called the erase time. However, the erase time decreases with temperature. Experiments show that the erase time at 100° C. is one half of the erase time at 0° C. as shown in FIG. 3. Thus, at low temperatures the memory cells take longer to discharge, while at elevated temperatures, they may be excessively erased. While such possibility could be avoided by shortening the length of the erase pulse, it may be too short for the memory Cells to sufficiently discharge at low temperatures.

SUMMARY OF THE INVENTION

It is therefore an object of the present invention to increase the operating speed of a memory by stabilizing its operating characteristics against temperature variations.

According to a first aspect of the present invention, there is provided memory comprising a matrix array of memory cells, each of the memory cells comprising a control gate, and first and second terminals for defining a channel therebetween, the second terminals of the memory cells being connected to a common circuit node, a row select circuit for selecting a row of the memory cells and supplying a first voltage to the control gates of the memory cells of the selected row during a write mode, and a column select circuit for selecting a column of the memory cells during the write mode. A control circuit is provided for supplying a second voltage which varies positively as a function of temperature to the first terminals of the memory cells of the selected column and setting the common circuit node at ground potential for trapping electrons in at least one of the memory cells during the write mode.

During an erase mode, the row select circuit may be arranged to hold the control gates of all memory cells at ground potential, and the control circuit is arranged to supply to the common circuit node a third voltage which varies negatively as a function of temperature to remove the trapped electrons from the memory cells.

According to a second aspect, the present invention provides a memory comprising a matrix array of memory cells, each of the memory cells comprising a control gate, and first and second terminals for defining a channel therebetween, the second terminals of the memory cells being connected to a common circuit node, a row select circuit for selecting a row of the memory cells and supplying a first voltage to the control gates of the memory cells of the selected row during a write mode and holding the control gates of the memory cells at ground potential during an erase mode, and a column select circuit for selecting a column of the memory cells during the write mode. A control circuit is provided for supplying a second voltage to the first terminals of the memory cells of the selected column and setting the common circuit node at ground potential for trapping electrons in at least one of the memory cells during the write rode, and supplying to the common circuit node a third voltage which varies negatively as a function of temperature to remove the trapped electrons from the memory cells.

BRIEF DESCRIPTION OF THE DRAWING

The present invention will be described in further detail with reference to the accompanying drawings, in which.

DETAILED DESCRIPTION

Figure 5:
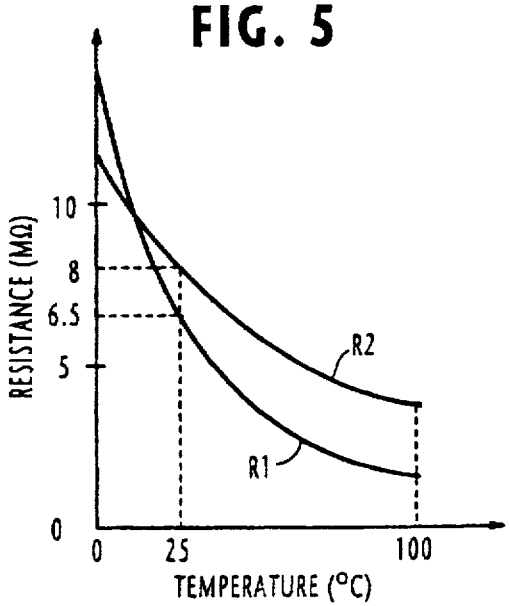
FIG. 5 is a graphic representation of the negative temperature characteristics of the resistors used in the write circuit of this invention.
Figure 4:
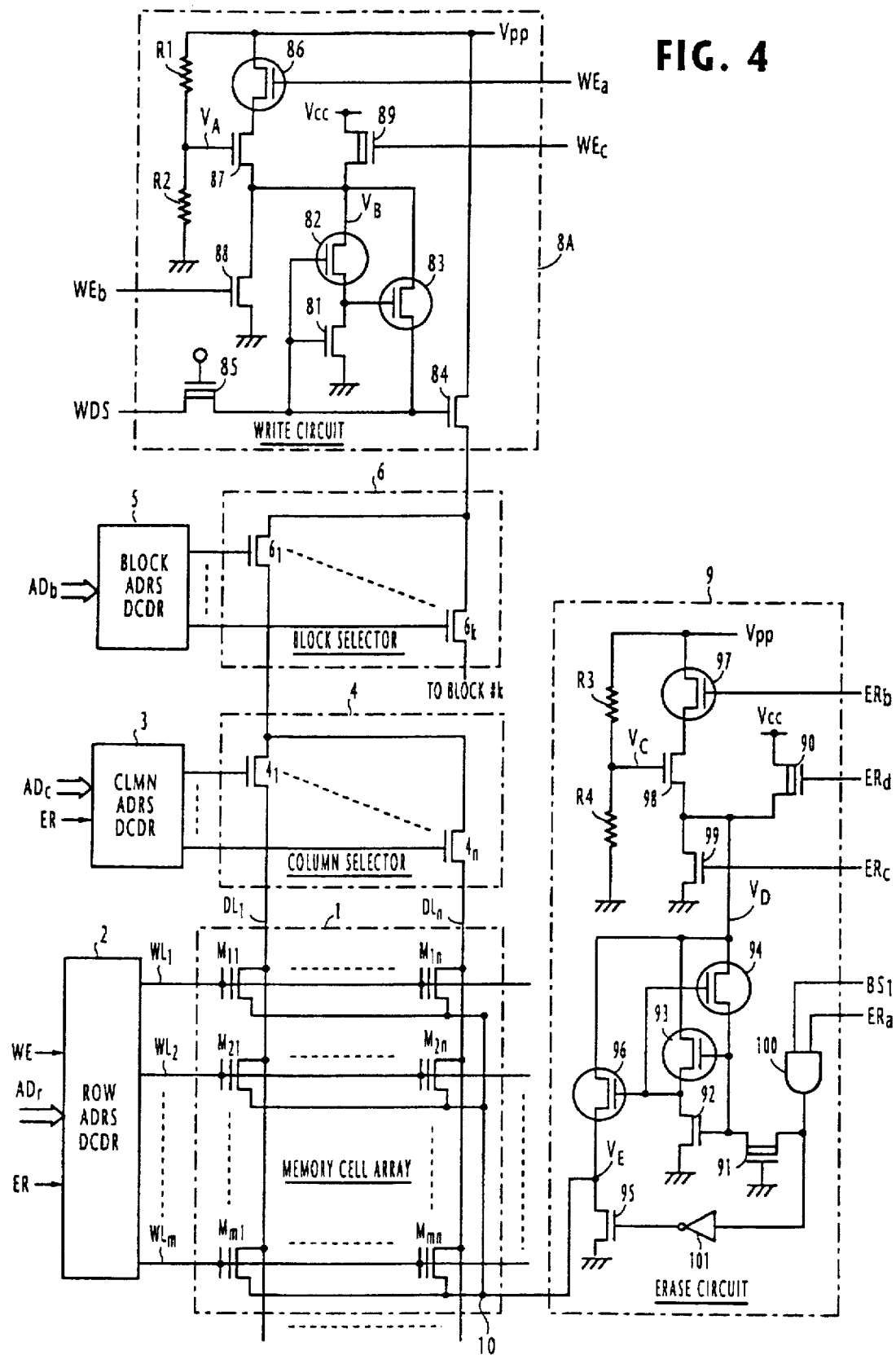
FIG. 4 is a circuit diagram of a nonvolatile memory according to the present invention.

As shown in FIG. 4, a nonvolatile memory according to the present invention has a write circuit 8A and an erase circuit 9. The write circuit 8A differs from the prior art write circuit 8 by the inclusion of transistors 86 to 89, and resistors R1 and R2 connected between voltage Vpp and ground. These resistors are formed by polysilicon doped with impurities so that they exhibit negative temperature coefficients as indicated by respective curves in FIG. 5. These curves are determined by the relation $R_0 \exp(E_0/kT)$, where $R_0$ is a constant, $E_0$ represents activation energy, k the Boltzmann constant, and T the temperature. The $R_0$ and $E_0$ factors are determined by the polysilicon structures of the resistors as well by the concentration of doped impurities.

Figure 6:
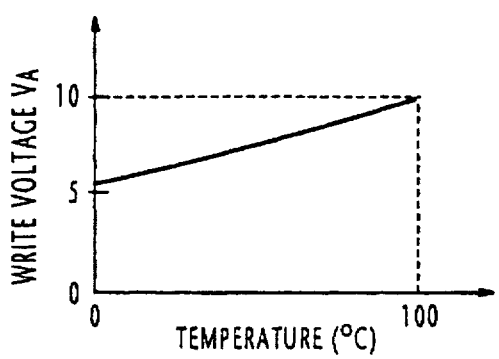
FIG. 6 is a graphic representation of the positive temperature characteristic of a reference voltage used in the present invention for the writing operation of the memory cells.

A combination of appropriately selected different values of the activation energy $E_0$ is used for resistors R1 and R2 to produce a desired temperature-dependent reference voltage $V_A$. In a preferred embodiment, $E_0$=0.2 eV and $E_0$=0.1 eV are respectively used for resistors R1 and R2, so that the reference voltage $V_A$ having a positive temperature characteristic is developed at the junction between resistors R1 and R2. As shown in FIG. 6, the reference voltage $V_A$ follows a curve that increases from about 5 volts to 10 volts when temperature varies in the range from 0° C. to 100° C. In the illustrated embodiment, the values of resistors R1 and R2 are 6.5 and 8.0 megohms, respectively, at 25° C.

Figure 1:
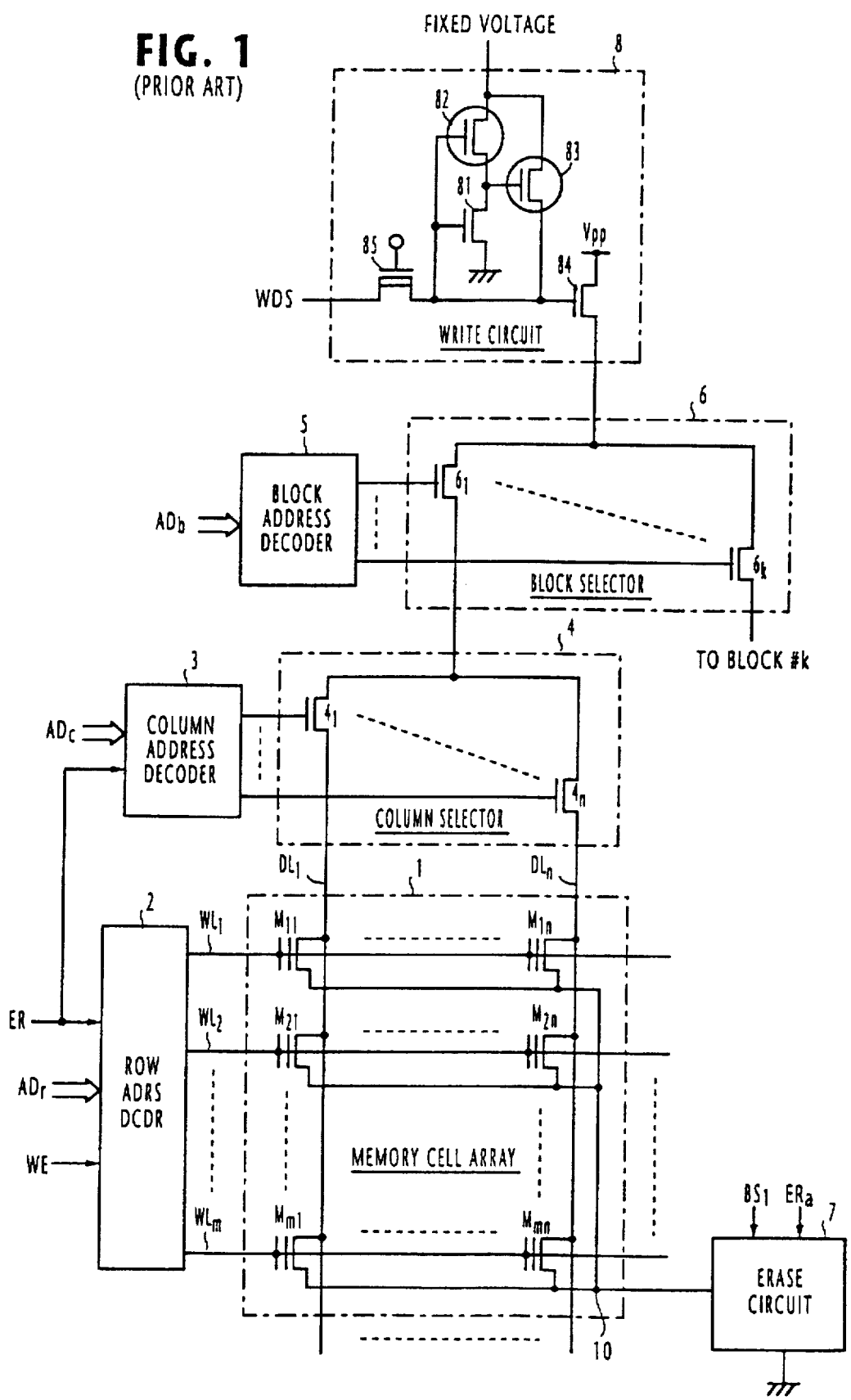
FIG. 1 is a circuit diagram of a prior art nonvolatile memory.
Figure 2:
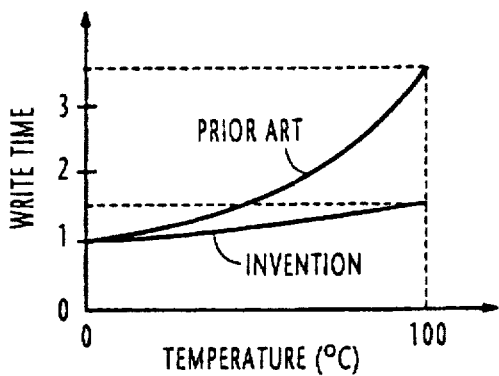
FIG. 2 is a graphic representation of write times for comparison between the prior art and the present invention.

The reference voltage $V_A$ is supplied to the gate of an N-channel transistor 87 whose drain is connected through the drain-source path of P-channel transistor 86 to a source of voltage Vpp and whose source is connected to ground via the drain-source path of N-channel transistor 88. A write enable pulses $WE_a$ and $WE_b$ are respectively supplied to the gates of transistors 86 and 88. The junction between transistors 87 and 88 is connected to the source of N-type depletion-mode transistor 89 whose drain is connected to voltage Vcc. Transistor 89 is responsive to a write enable pulse $WE_c$ for supplying a voltage $V_B$ corresponding to the reference voltage $V_A$ to the gate of transistor 84 via transistor 83. Since the reference voltage $V_A$ increases with decrease in conductance of transistors 84, $6_j$ and $4_j$ as temperature increases, the current supplied to memory cells $M_{ij}$ via transistors 84, $6_j$ and $4_j$ is maintained substantially constant under varying temperatures. As indicated in FIG. 2, the write time ratio of the present invention between 0° C. and 100° C. is 1:1.5, which favorably compares with the prior art ratio of 1:3.5. The write circuit of this invention allows the threshold level of the memory cells to come within the specified range at the end of an write operation regardless of temperature variations even if the write voltage pulse of constant duration is used.

The erase circuit 9 of this invention is comprised by transistors 90 to 99. Transistor 91 is an N-channel depletion-mode transistor having its gate grounded and its source-drain path connected between an AND gate 100 and the gates of N-channel transistor 92 and P-channel transistor 93 which are connected in series with the source-drain path of P-channel transistor 93. A P-channel transistor 94 has its source-drain path connected across the gate and source of transistor 93 and has its gate connected to the drains of transistors 92 and 93. A P-channel transistor 96 has its source-drain path connected across the source of transistor 94 and the drain of N-channel transistor 95 and has its gate connected to the drains of transistors 92 and 93.

Coincidence between block select signal $BS_l$ and erase pulse $ER_a$ is detected by an AND gate 100 to turn on transistors 92, 94 and 96 and turn off transistors 93 and 95. An inverter 101 is connected to the output of AND gate 100 to turn on transistor 95 to supply ground potential to the source terminals of all memory cells when no coincidence is detected by the AND gate.

Figure 7:
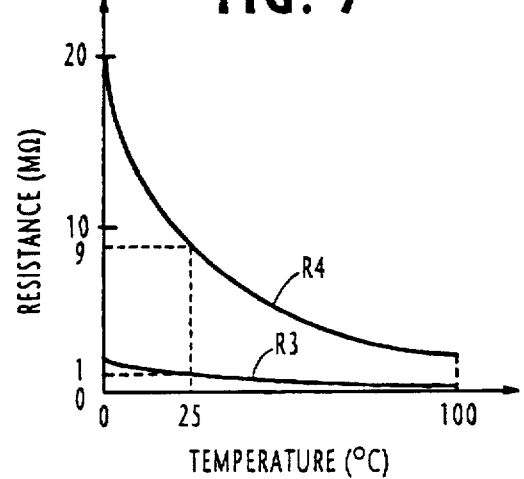
FIG. 7 is a graphic representation of the negative temperature characteristic of the resistors used in the erase circuit of this invention.

Resistors R3 and R4 are connected between voltage Vpp and ground. Similar to resistors R1 and R2, resistors R3 and R4 a reformed by polysilicon doped with impurities using a combination of difference values of activation energy so that they exhibit negative temperature coefficients as indicated by respective curves in FIG. 7. In a preferred embodiment, the activation energies $E_0$ of resistors R3 and R4 are 0.1 eV and 0.2 eV, respectively, so that a reference voltage $V_C$ having a negative temperature characteristic is developed at the junction between R3 and R4. In the illustrated embodiment, the values of resistors R3 and R4 are 1.0 and 9.0 megohms, respectively, at 25° C.

Figure 8:
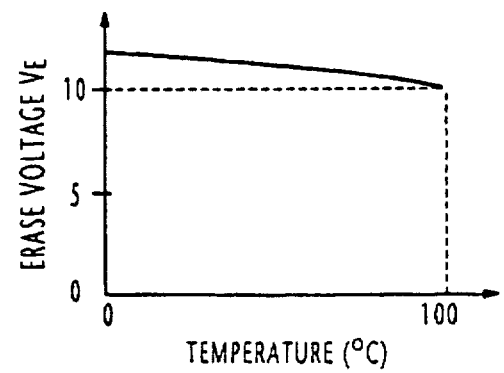
FIG. 8 is a graphic representation of the negative temperature characteristic of a reference voltage used in the present invention for the erasing operation of the memory cells.

The reference voltage $V_C$ is supplied to the gate of an N-channel transistor 98 whose drain is connected through the source-drain path of P-channel transistor 97 to a source of voltage Vpp, and whose source is connected to ground via the drain-source path of N-channel transistor 99. Erase pulses $ER_b$ and $ER_c$ are respectively supplied to the gates of transistors 97 and 99. The junction between transistors 98 and 99 is connected to the source of N-type depletion-mode transistor 90 whose drain is connected to voltage Vcc. Transistor 90 is responsive to an erase pulse $ER_d$ for supplying a voltage $V_D$ corresponding to the reference voltage $V_C$ to the sources of transistors 93, 94 and 96. As a result, an erase voltage $V_E$ is supplied from transistor 96 to the source of all the memory cells. As shown in FIG. 8, the voltage $V_E$ follows a curve that decreases from about 12 volts to 10 volts when temperature varies in the range from 0° C. to 100° C. The application of the erase voltage $V_E$ to the memory cell array 1 compensates for the temperature dependent erase time characteristic of the memory array. It is seen the write circuit 8A and the erase circuit 9 cooperate with each other to form a control circuit to control the write and erase modes of operation.

Figure 3:
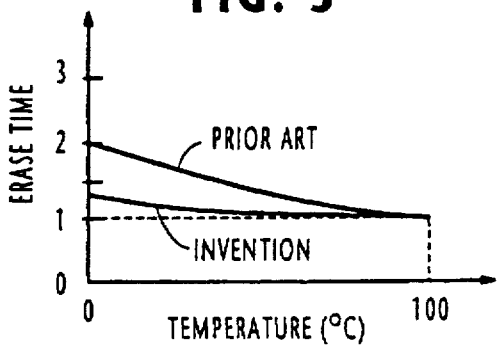
FIG. 3 is a graphic representation of erase times for comparison between the prior art and the present invention.

In this way, all memory cells are supplied with relatively high erase voltage when operating at low temperatures to produce a relatively high electric field between the source and floating gate of each memory cell to increase the Fowler-Nordheim tunneling current. Experiments show that the erase time ratio of the present invention between 0° C. and 100° C. is 1.3:1 as illustrated in FIG. 3, which favorably compares with the prior art erase time ratio of 2:1. The erase circuit of this Invention prevents the memory cells from being excessively erased and allows their threshold level to come within the specified range at the end of an erase operation regardless of temperature variations even if the erase voltage $V_E$ of constant duration is applied to the memory cells.

What is claimed is:

1. A memory comprising:

a matrix array of memory cells, each of the memory cells comprising a control gate, and first and second terminals for defining a channel therebetween, the second terminals of said memory cells being connected to a common circuit node;

a row select circuit for selecting a row of said memory cells and supplying a first voltage to the control gates of the memory cells of the selected row during a write mode;

a column select circuit for selecting a column of said memory cells during said write mode; and a control circuit for supplying a second voltage which varies positively as a function of temperature to the first terminals of the memory cells of the selected column and setting the common circuit node at ground potential for trapping electrons in at least one of said memory cells during said write mode.

2. A memory as claimed in claim 1, wherein said control circuit includes resistance elements having negative temperature coefficients, said resistance elements being connected in series to pass a current therethrough to develop said second voltage at a junction therebetween.

3. A memory as claimed in claim 2, wherein said resistance elements have different values of activation energy.

4. A memory as claimed in claim 1, wherein said column select circuit comprises a plurality of transistors connected between said control circuit and the first terminals of said memory cells, and a decoder for selecting one of said transistors, each of said transistors having a tendency to decrease the conductance thereof as a function of temperature, and said second voltage positively varying as a function of temperature to compensate for said tendency.

5. A memory as claimed in claim 1, wherein said row select circuit is arranged to hold the control gates of all memory cells at ground potential during an erase mode, and said control circuit is arranged to supply to said common circuit node a third voltage varying negatively as a function of temperature to remove the trapped electrons from the memory cells.

6. A memory as claimed in claim 5, wherein said control circuit further includes resistance elements having negative temperature coefficients, said resistance elements being connected in series to pass a current therethrough to develop said third voltage at a junction therebetween.

7. A memory as claimed in claim 6, wherein said resistance elements have different values of activation energy.

8. A memory comprising:

a matrix array of memory cells, each of the memory cells comprising a control gate, and firsts and second terminals for defining a channel therebetween, the second terminals of said memory cells being connected to a common circuit node;

a row select circuit for selecting a row of said memory cells and supplying a first voltage to the control gates of the memory cells of the selected row during a write mode and holding the control gates of said memory cells at ground potential during an erase mode;

a column select circuit for selecting a column of said memory cells during said write mode; and a control circuit for supplying a second voltage to the first terminals of the memory cells of the selected column and setting the common circuit node at ground potential for trapping electrons in at least one of said memory cells during said write mode, and supplying to said common circuit node a third voltage varying negatively as a function of temperature to remove the trapped electrons from the memory cells during said erase mode.

9. A memory as claimed in claim 8, wherein said control circuit further includes resistance elements having negative temperature coefficients, said resistance elements being connected in series to pass a current therethrough to develop said third voltage at a junction therebetween.

10. A memory as claimed in claim 9, wherein said resistance elements have different values of activation energy.

11. In a memory comprising a matrix array of memory cells, each of the memory cells comprising a control gate, and first and second terminals for defining a channel therebetween, the second terminals of said memory cells being connected to a common circuit node, a method comprising the steps of;

a) selecting a row of said memory cells and a column of said memory cells during a write mode; and b) supplying a first voltage to the control gates of the memory cells of the selected row, a second voltage which varies positively as a function of temperature to the first terminals of the memory cells of the selected column, and ground potential to the common circuit node for trapping electrons in at least one of said memory cells.

12. A method as claimed in claim 11, wherein the step b) further comprises the step of supplying ground potential to the control gates of all memory cells and a third voltage which varies negatively as a function of temperature to said common circuit node to remove the trapped electrons from the memory cells during an erase mode.

13. In a memory comprising a matrix array of memory cells, each of the memory cells comprising a control gate, and first and second terminals for defining a channel therebetween, the second terminals of said memory cells being connected to a common circuit node, a method comprising the steps of;

a) selecting a row of said memory cells and a column of said memory cells during a write mode; and b) supplying a first voltage to the control gates of the memory cells of the selected row, a second voltage to the first terminals of the memory cells of the selected column, and ground potential to the common circuit node for trapping electrons in at least one of said memory cells during said write mode, and supplying ground potential to the control gates of all memory cells and a third voltage which varies negatively as a function of temperature to said common circuit node to remove the trapped electrons from the memory cells during an erase mode.

* * * * *

UNITED STATES PATENT AND TRADEMARK OFFICE
CERTIFICATE OF CORRECTION

PATENT NO. : 5,768,189
DATED : June 16, 1998
INVENTOR(S) : Mariko TAKAHASHI

It is certified that error appears in the above-identified patent and that said Letters Patent is hereby corrected as shown below:

On the title page, Foreign Application Priority Data was omitted, please insert --Japan 8-74504 March 28, 1996--.

Signed and Sealed this

Sixteenth Day of March, 1999

Attest:

Q. TODD DICKINSON

Attesting Officer

Acting Commissioner of Patents and Trademarks